United States Patent [19]

Kenner et al.

[11] 4,374,432
[45] Feb. 15, 1983

[54] READ SYSTEMS FOR 2½D COINCIDENT CURRENT MAGNETIC CORE MEMORY

[75] Inventors: Bernard A. Kenner, Rancho Palos Verdes; John R. Conaway, San Jose, both of Calif.

[73] Assignee: Electronic Memories and Magnetics Corporation, Encino, Calif.

[21] Appl. No.: 42,796

[22] Filed: May 29, 1979

[51] Int. Cl.³ .................... G11C 5/08; G11C 7/02; G11C 11/06
[52] U.S. Cl. .................... 365/209; 365/130; 365/243
[58] Field of Search ............. 365/206, 209, 130, 243

[56] References Cited

U.S. PATENT DOCUMENTS

| | | | |
|---|---|---|---|
| 3,504,356 | 3/1970 | Patel et al. | 365/209 |
| 3,510,856 | 5/1970 | Cline | 365/209 |
| 3,648,259 | 3/1972 | Fisher et al. | 365/206 |
| 3,651,497 | 3/1972 | Cook | 365/243 |

Primary Examiner—James W. Moffitt
Attorney, Agent, or Firm—Seymour A. Scholnick

[57] ABSTRACT

Organizations are disclosed for driving bit lines of a two-line 2½D coincident current magnetic core memory in which a bit line not used for reading a bit out of a core is placed physically in parallel with the bit line driven by half select current to approximate in the unused line the capacitive and inductive coupling of the driven line with the word drive line. That coupling produces in the unused line the same noise (crosstalk) produced in the driven bit line by the word drive pulse. The crosstalk signal in the unused line is subtracted from the signal in the driven bit line before amplification and detection. The unused line may be a separate dummy line, or simply another bit line not being used for the bit being read out. In the case of paired bit lines used for common mode rejection of the bit drive signal, a second pair of unused bit lines is arranged in parallel for crosstalk cancellation.

14 Claims, 9 Drawing Figures

READ SYSTEMS FOR 2½D COINCIDENT CURRENT MAGNETIC CORE MEMORY

BACKGROUND OF THE INVENTION

This invention relates to organizations for a two-wire 2½D coincident current core memory comprised of an array of toroidal cores, each core having a bit line driven by half select current and a word select line driven by half select current, and more particularly to organization for bit select (Y drive) lines time shared to read for both drive and sense functions with cancellation of cross-coupled noise from word select (X drive) lines.

In a two-line 2½D memory, selected X and Y drive lines are energized with half select current of the proper polarity for both read and write operations. Typically, the X line selects a word consisting of a number of bits, but first a number of Y drive lines are energized to select the bits. Thus, to read a word, the selected bit lines are energized, and after all ringing of the bit lines has subsided, the word line is energized. Both X and Y drive currents for each bit will have the same direction through the core to set it to the bit 0 state. If the core had previously stored a bit 1, the flux of the core being switched to a bit 0 reduces a pulse on its bit line. The bit line may thus be used as a sense line, provided noise from the word select pulse also induced into the bit line can be cancelled. There are three configurations commonly used for achieving that cancellation.

Figure 1A:
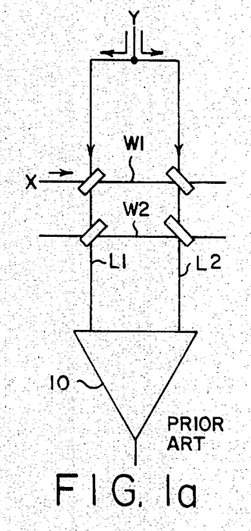
FIGS. 1a, 1b and 1c illustrate three prior art arrangements for two-wire 2½D coincident current core memories.

One configuration, shown in FIG. 1a, uses the same Y bit drive current to energize two bit lines L1 and L2 equally. One bit line passes through its cores in one direction relative to the X word drive line W1, and the other bit lines passes through its cores in the other direction. Since the word drive line passes through corresponding cores of both bit lines in the same direction, only one core is "selected" to receive coincident half select current for read, or write, of the same sense, i.e., direction through the core. The other core receives half select current in one direction, and the other half in the other direction, so it is not switched. The paired lines are connected to a differential sense amplifier 10 so that only the difference in the currents on the paired sense lines will be amplified. As a consequence, the effects of the X drive pulse in the two lines will cancel, and only the line with the selected core that is switched will have any uncancelled current pulse which is sensed and amplified as a bit 1. A memory system employing this configuration for common-mode signal rejection is disclosed by the inventor in U.S. Pat. No. 3,693,176.

Figure 1B:
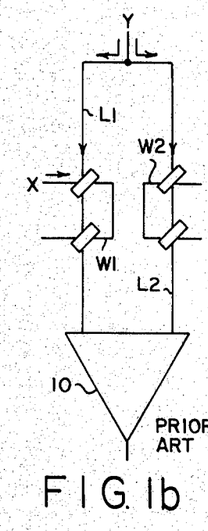
Figure 1C:
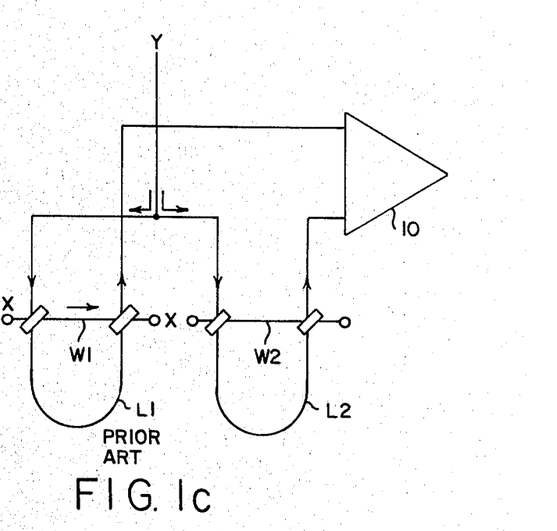

A second configuration very similar to the first employs paired bit drive lines, but instead of placing the corresponding cores of two different words on the two different bit lines L1 and L2, they are placed on the same bit lines, and the word select line W1 is folded as shown in FIG. 1b so that the word select pulse cancels itself on the selected bit line. Another variation folds the bit lines instead, as shown in FIG. 1c. These folded-line arrangements have a significant packaging advantage (lower wire termination density) over the unfolded arrangement of balanced sense lines and word lines in FIG. 1a, which allows significant cost reduction.

Figure 2:
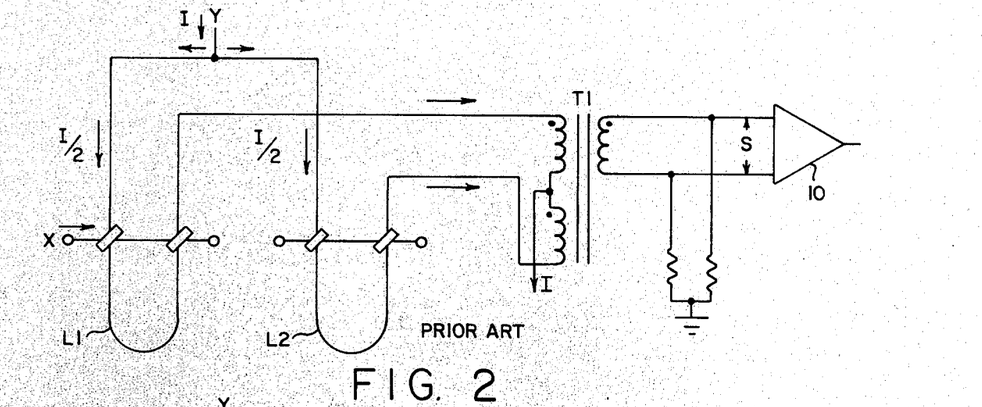
FIG. 2 illustrates the manner in which a balun transformer is used to advantage to couple paired bit lines in the arrangement of FIG. 1C to a sense amplifier.

In any of these arrangements, the sense amplifier 10 is preferably coupled to the bit drive lines by a balun transformer T1 shown in FIG. 2 for the arrangement of FIG. 1c. However, magnetic and capacitive coupling between word and bit lines with either of the folded or the unfolded arrangements is now inherently imbalanced, and such imbalance can be minimized only by elaborate packaging methods. What is required is an arrangement which does not require balanced magnetic and capacitive coupling, yet still permits selecting paired bit lines for reading out a word, one bit out of each pair of bit lines with cancelled X word drive current induced into the Y bit drive lines.

SUMMARY OF THE INVENTION

In accordance with the invention, bit lines of a two-line 2½D coincident current magnetic core memory are arranged for reading to be physically in parallel with unused bit lines for balanced capacitive and inductive coupling between a word drive line and the parallel bit drive lines. Any noise signal in the selected bit line and its parallel unused bit lines are thus capacitively and inductively balanced for cancellation at the input of bit sense amplifiers. In one exemplary embodiment, the other unselected bit lines are paired dummy lines physically in parallel with selected bit lines connected to opposite ends of a sense transformer. The paired dummy lines are connected to opposite ends of a primary winding of a second transformer having its secondary winding in series with the secondary winding of the sense transformer. In a preferred embodiment, the physically parallel bit lines are two sets of paired and folded bit lines, only one set of which is selected by switching means to receive bit drive current. The unselected pair corresponds to the dummy lines of the exemplary embodiment. Diode switches are provided to automatically connect the unselected pair to opposite ends of the primary winding of the second transformer. The arrangement is otherwise the same as in the exemplary embodiment. The bit read out is sensed by a differential amplifier as the signal difference between the selected set. In another preferred embodiment, the physically parallel bit lines are only two in a set and both have the same word line. One bit line is selected to conduct half select current from a source at one end of the primary winding of a bit sensing transformer connected to a differential sense amplifier, but the other (unselected) bit line connected to the same half select current source is not. Instead, diode switching means automatically connects the unselected bit line to the other end of the primary winding of the sense transformer. This allows only a trickle of current through the unselected bit line so that its cores cannot be switched by the common X word drive line. In that manner, the differential voltage across the primary winding of the sense transformer consists of a signal with capacitively and magnetically induced noise from the X word drive line appearing as a common mode signal on both bit lines which cancel at the sense transformer.

The novel features of the invention are set forth with particularity in the appended claims. The invention will best be understood from the following description when read in conjunction with the accompanying drawings.

DESCRIPTION OF PREFERRED EMBODIMENTS

Figure 3:
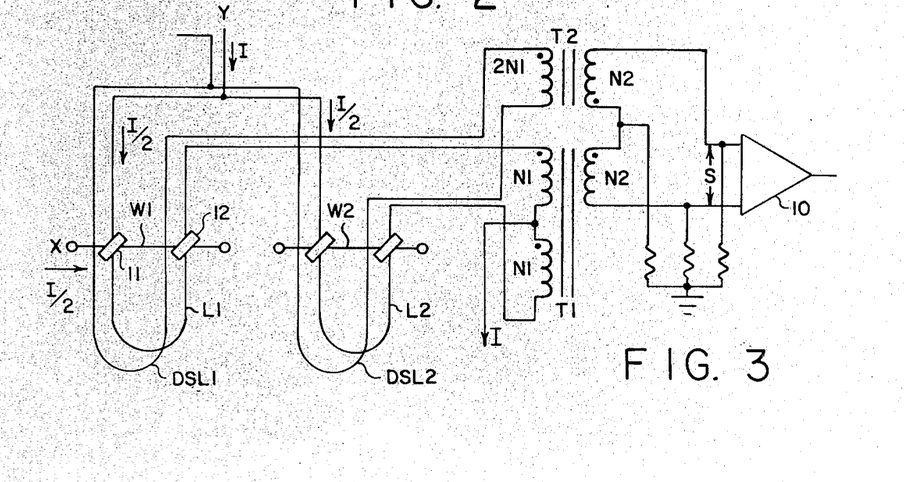
FIG. 3 exemplifies the manner in which the secondary winding of an anti-sense transformer is connected in series with the secondary winding of a balun transformer of FIG. 2 to couple word line induced noise from a dummy pair of lines, disposed parallel to a selected pair of bit lines, for cancellation in accordance with the present invention.

Referring now to FIG. 3, it will be noted by comparing it to FIG. 2 that paired bit lines L1 and L2 are coupled by a balun transformer T1 to a differential sense amplifier 10 in the folded Y bit line arrangement as shown in FIG. 1c. (The same reference numerals are being retained in the various figures for corresponding elements in order to facilitate comparison and understanding). The difference in the arrangement of FIG. 3, which exemplifies the present invention, is that unused (dummy) sense lines DSL1 and DSL2 are placed in a physically parallel arrangement with the used bit drive lines L1 and L2. In a read operation, the Y (bit) select current I is turned on first. It divides about equally into the selected lines L1 and L2 of a memory array. The selected W (word) drive line W1 is then pulsed. Since the line W1 intersects only the line L1, it will switch only core 11 from a bit 1 to a bit 0 state because the half select X and half select Y currents pass through only that core in the same direction. (To select another word with line W1, the polarity of the word select pulse is reversed and only a core 12 is switched.) Switching a core induces a bit-1 signal in the bit line L1. If the selected core 11 had been storing a bit 0, a bit-0 signal is induced in the bit line L1 with some noise. A noise signal is also induced at the core 12 which is not switched even if it is storing a bit 1 because it does not receive half select current on the line L1 in the same direction. The noise signal (referred to hereinafter as crosstalk) includes core reversible flux as well as inductively and capacitively coupled components from the word select pulse on the line W1.

The differential sense signal S is detected by the differential sense amplifier 10 which is coupled to the paired lines L1 and L2 by the balun transformer T1 that rejects the common mode signal and presents the difference at the secondary winding of the transformer T1. A transformer T2 is used for common mode rejection of the signal on the dummy lines DSL1 and DSL2, and the output at the secondary winding of the transformer T2 is subtracted by adding it out of phase to the output of the sense transformer T1. Since the crosstalk from the word drive line is approximately the same in the dummy lines as in the used lines, the crosstalk portion of the sensed signal will be cancelled from the output of the sense amplifier 10.

It should be noted that a balun sense transformer T1 has two primary windings of the same number (N1) of turns, and the secondary winding usually has a larger number (N2) to provide a step-up transformer. The secondary winding of the transformer T2 also has the same number (N2) of turns for a balanced common mode rejection into the amplifier 10. Since the transformer T2 has only one primary winding, and the same step-up ratio is to be maintained as for the transformer T1, the primary winding of the transformer T2 has twice the number of turns as the primary windings of the transformer T1. In other words, the arrangement of one primary winding in the transformer T2 is the equivalent of the arrangement of two primary windings in the transformer T1.

In practice, a number of bit drive lines share the same sense transformer. There may also be a number of dummy lines for the bit drive lines. Multiplexing diode switches are then provided to make the necessary connections.

This exemplary embodiment shown in FIG. 3 has the advantages of folded Y-drive lines, but the same technique for cancellation of X-drive crosstalk could be used to equal advantage in the unfolded configuration of FIG. 1a. The problem in either case is that unused (dummy) lines must be provided, adding to the expense, bulk and weight of the memory. A preferred arrangement for practicing the present invention is therefore one shown in FIG. 4 which is like the arrangement of FIG. 3, except that the unused lines providing X-drive crosstalk cancellation are paired bit drive lines not being used for the selected word. Two sets of paired bit drive lines L1a, L2a and L1b, L2b are arranged to be physically parallel so that a line of one pair serves as the unused (dummy) line for a bit line selected from the other pair. Diodes 14 connected to a load resistor $R_L$ automatically switch the unselected pair of bit drive lines to primary windings of a balun transformer T22. (This type of transformer is here used to facilitate implementing the switching arrangement of the multiplexing diodes, but it is otherwise equivalent to the transformer T2 in FIG. 3.) Selection of one pair or the other of the lines is by Y-drive switch pair YD0 and switch pair YD1. Only one switch pair is turned on at a time to connect the paired lines L1a and L1b through switch pair YD0 or the paired lines L2a and L2b through the switch pair YD1 to the transformer T1.

Figure 4:
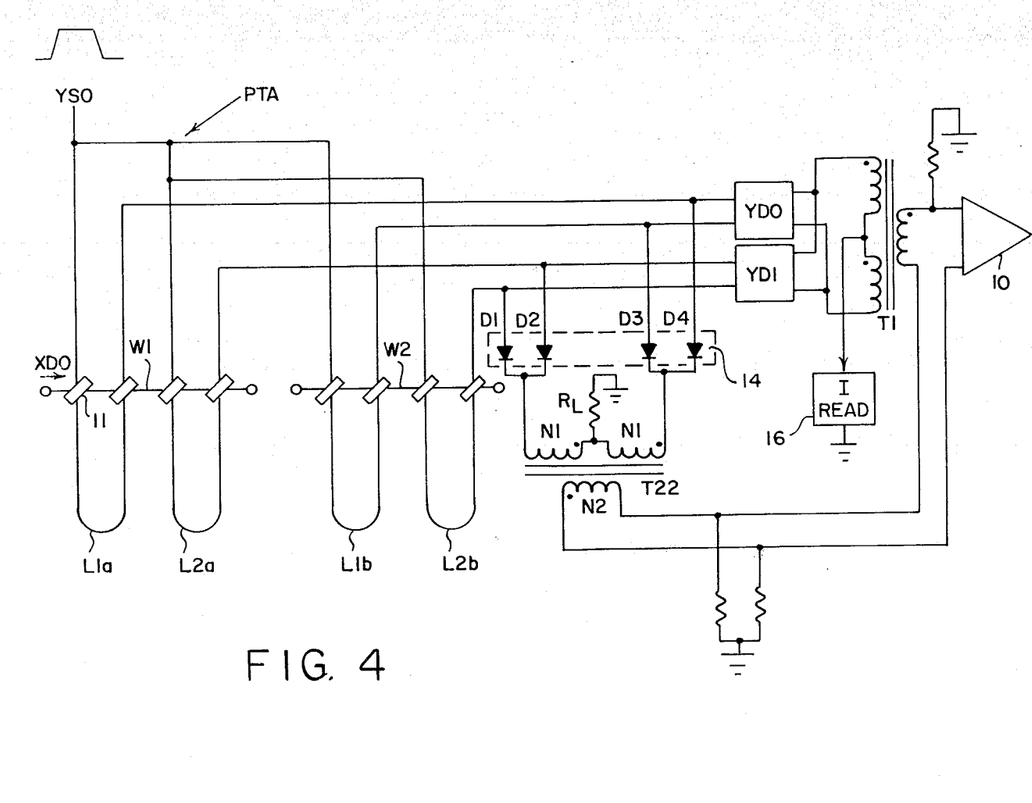
FIG. 4 illustrates a preferred arrangement for the concept illustrated in FIG. 3.

In operation, a signal (typically five volts) at terminal YS0 selects all of the group of Y-drive lines connected at junction PTA, but only one pair of bit drive lines will conduct current as selected by the switch pairs YD0 and YD1. A source 16 provides the amplitude of current necessary to read. If switch pair YD0 is activated (closed), current flows in lines L1a and L1b. Diodes D1 and D2 are then forward biased, whereas diodes D3 and D4 are not. This is so because conduction through the lines L1a and L1b, as determined by the high impedance current source 16, drops the voltage on the anodes of the diodes D3 and D4 enough so that they are insufficiently forward biased to conduct. But switch pair YD1 is not conducting so that the +5 volts at the junction PTA applied to lines L2a and L2b will forward bias the diodes D1 and D2.

After the Y-drive current has become steady through the selected lines L1a and L1b, the selected word drive line W1 is pulsed. Only the core 11 will have half select current in the same direction in both X and Y lines to switch it. A small trickle of current flows through lines L2a and L2b adequate to forward bias diodes D1 and D2, but not enough to affect system operating margins. When that core 11 is switched, it induces a bit-1 pulse on the line L1a which is balanced with the line L1b so that it can be sensed, as described with reference to FIG. 2. But the word select line W1 crosses only the line L1a, so as to induce crosstalk in the line L1a and not L1b. This crosstalk would make sensing of the bit-1 signal more difficult, so it is cancelled by the crosstalk induced in the line L2a. It is thus clear that lines L1a and L2a are paired for crosstalk cancellation via transformer T22 while lines L1a and L1b are paired for balanced bit-drive of the sense transformer. Similarly, lines L1b and L2b are paired for crosstalk cancellation via transformer T22 while lines L2a and L2b are paired for balanced bit-drive of the sense transformer T1. The bit lines paired for crosstalk cancellation are physically parallel in approximately the same paths in the memory so they will have substantially the same capacitive and inductive crosstalk from the word drive line.

The preferred embodiment has been described with reference to FIG. 4 in a minimum arrangement, which is two paired lines L1a, L1b and L2a, L2b, each pair for common mode signal rejection of the Y drive current when selected, and the other pair for cancellation of crosstalk from the X drive line during a read cycle in accordance with this invention. For a better understanding of how a more complete memory may be organized for both read and write cycles, with the present invention implemented for a read cycle, reference is now made to FIG. 5.

Figure 5:
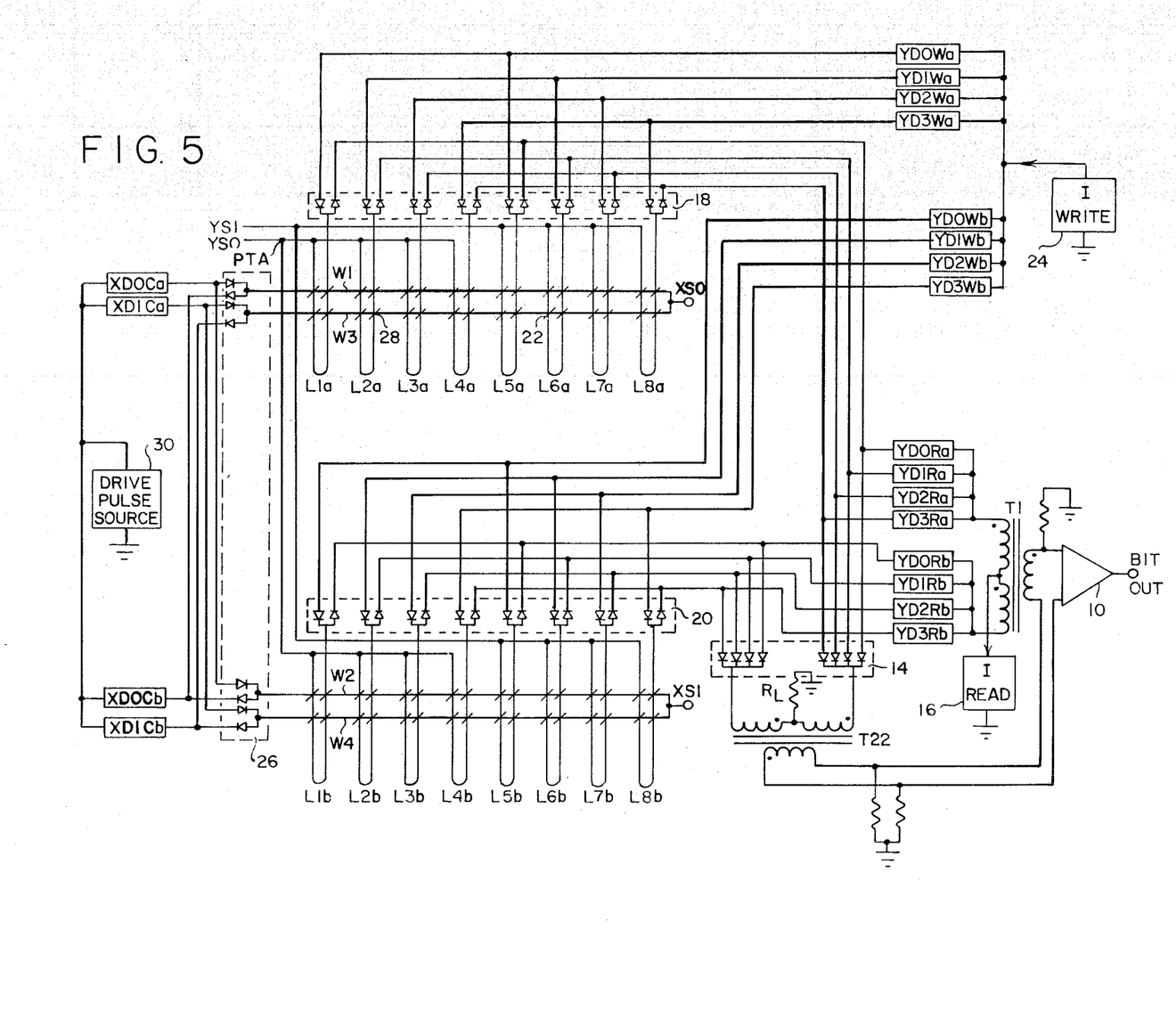
FIG. 5 is a diagram illustrating how the arrangement shown in FIG. 4 may be used to implement a full memory.

To facilitate understanding how the arrangement of FIG. 4 is embodied in FIG. 5, the same reference numerals are maintained for the paired bit (Y) drive lines L1a, L1b and L2a, L2b. Two additional pairs L3a, L3b and L4a, L4b are added to the Y-sink terminal YS0. Each pair for common mode signal rejection is separated in the drawing to group all of the "a" lines together above, and all of the "b" lines together below since the "a" lines are connected to the bottom end of the balun sense transformer T1 when selected for use during a read cycle by the switch pair YD0 and the switch pair YD1 now shown with the pair YD0 separated into switches YD0Ra and YD0Rb, and the pair YD1 separated into switches YD1Ra and YD1Rb. The additional pairs L3a, L3b and L4a, L4b are arranged in a strictly analogous and symmetrically way as the first two pairs.

The symmetry of the selection switches at the sense transformer T1 and the multiplexing diodes 14 at the noise cancellation transformer T22 is maintained. The only difference as to the four pairs is that the "a" lines are shown above as a group, and the "b" lines are shown below as a group. This grouping is a natural arrangement because the "a" lines are crossed by one set of word drive lines while the "b" lines are crossed by another set of word drive lines. When a core in one group is to be read from one of the paired "a" and "b" lines, the other of the pulsed lines is used to provide common mode signal injection. All of the remaining "a" and "b" lines of unselected pairs grouped together in the "a" group and in the "b" group are physically parallel to each other in the "a" and "b" groups. In addition, all of the remaining "a" and "b" lines of unselected pairs are coupled to the crosstalk rejection transformer T22 where bit drive current in the unselected pairs cancel and the crosstalk signal is developed for subtraction from the sensed output into the amplifier 10.

It should be noted that the arrangement thus far described with reference to four pair of bit drive lines concerns only one bit of a word. Other identical arrangements are provided for other bits of a word, each arrangement with its own bit sense amplifier 10, but all sharing the same word select lines.

A second Y-sink terminal YS1 can be provided to accommodate another four pairs of bit drive lines L5a, L5b; L6a, L6b; L7a, L7b; and L8a, L8b. These four pairs time share the four paired V-drive read switches connected to the transformer T1, and the diode multiplexing switches connected to the transformer T22. Banks of isolation (buffer) diodes 18 and 20 prevent any Y-select current in a pair of bit drive lines selected from the YS0 terminal from energizing bit drive lines not selected from the YS1 terminal.

The banks of isolation diodes include not only one diode for each bit drive line connected to one of the Y-drive select switches for a read cycle, but also one diode for each bit drive line connected to Y-drive select switches for a write cycle shown in two groups of four, one "a" group labeled YD0Wa, YD1Wa, YD2Wa and YD3Wa, and one "b" group labeled YD0Wb, YD1Wb, YD2Wb and YD3Wb. A write cycle is executed in a conventional manner, and it does not include the transformers T1 and T22. For example, assume a core 22 is to be set to the "1" state in line L6a intersection by word line W3. The group of four bit drive lines that includes the line L6a is first selected by a negative pulse on the terminal YS1. Then shortly thereafter, the Y-drive switch YD1Wa is activated to provide negative half select current through the line L6a. While the terminal YS1 is still negative, and the switch YD1Wa is still activated, a terminal XS0 receives a positive pulse while a switch XD1Cb is activated to provide negative current through the word line W3, i.e., word select current in the same direction through the core 22 as the bit select current. The diode of the bank of isolation diodes 18 which connects the switch YD1Wa to the line L6a will conduct the necessary negative current, i.e., current from a source 24 to the terminal YS1, while all other diodes of the bank 18 are reverse biased and will therefore not conduct, thus isolating the current of the line L6a from all other bit lines connected to the terminal YS1. A bank 26 of buffer diodes similarly isolate one energized word line connected to a selectively activated terminal XS0 or XS1 from all other word lines.

Figure 6:
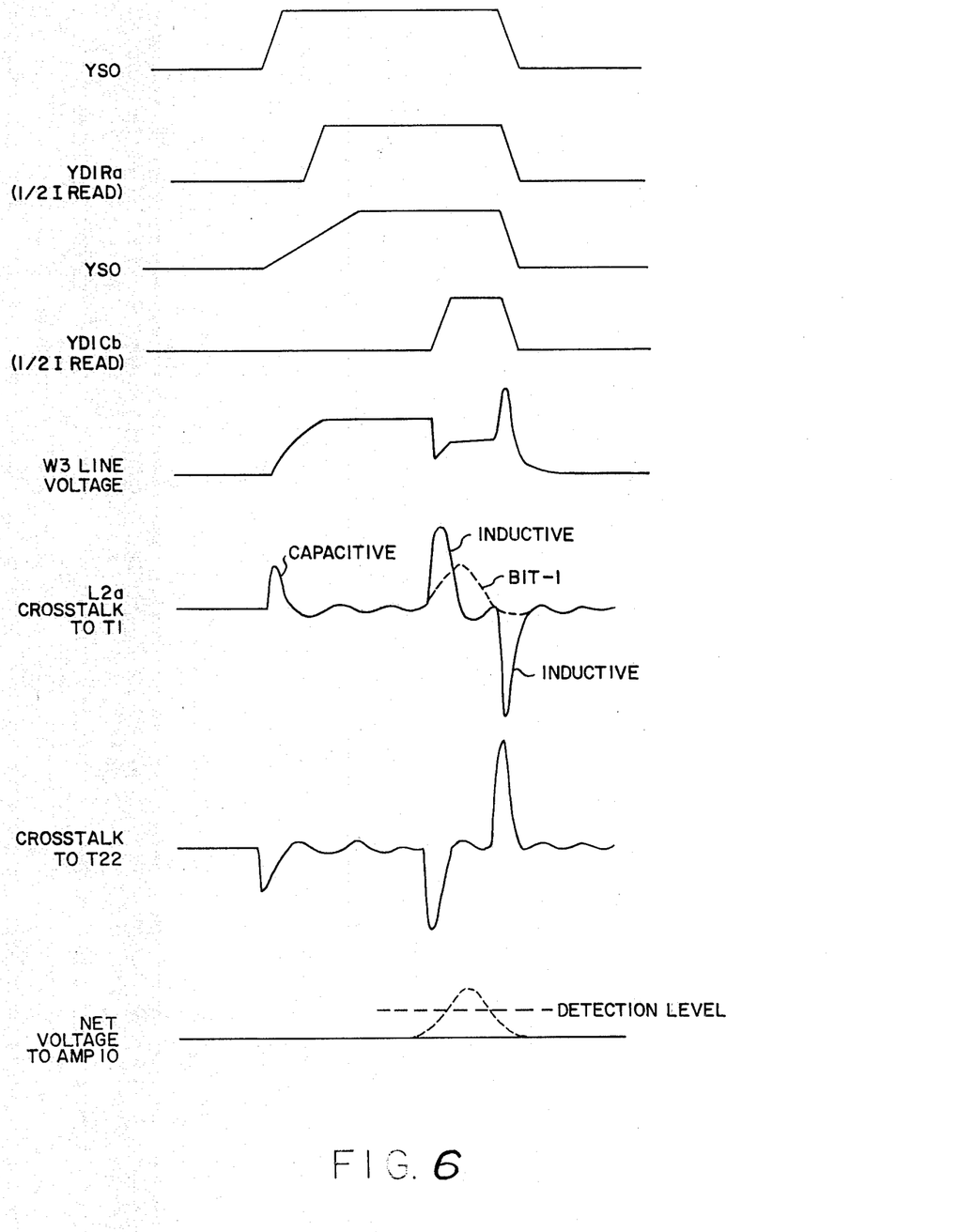
FIG. 6 shows waveforms useful in understanding the operation of the system shown in FIG. 5.

Operation during a read cycle will now be described by way of a summary for the arrangement shown in FIG. 5. Assuming a core 28 is to be read, the bit line L2a is first selected by applying a positive pulse to the terminal YS0, and then activating the half select read current from the source 16 through the paired switches YD1Ra and YD1Rb as shown in FIG. 6 for the switch YD1Ra. Meantime, the XS0 terminal is made positive to charge the word select line W3, and thereafter a read pulse of proper polarity from a source 30 is transmitted through an activated switch XD1Cb. The core 28 then has two half select currents through it of the same polarity to switch it to the "0" state. FIG. 6 shows the XS0 voltage and the XD1Cb current pulse. The voltage of the word line W3 will be affected by the read pulse, as shown in FIG. 6. The result of this shift in voltage on the word drive line W3 is to affect shifts in the bit line L2a to the transformer T1 that is not cancelled by the paired line L2b due first to capacitive and then to inductive coupling of the word drive line L3 to the bit line drive L2a. There will also be a pulse on the line L2a if the core 28 was previously storing a bit 1 as it is switched to the "0" state, as shown by a dotted line over the waveform that shows crosstalk to the transformer T1. It can be readily appreciated that such crosstalk makes detection of the bit-1 pulse read out very difficult, if not impossible in some extreme crosstalk situations as that illustrated in FIG. 6. To cancel that crosstalk to the transformer T1, all of the other lines L1a, L3a and L4a connected to one side of the transformer T22, and all of the corresponding lines L1b, L2b and L4b connected in parallel to the other end of the transformer T22, produce crosstalk to the transformer T22 that is substantially the same as the crosstalk to the transformer T1, but in antiphase, so that when added in the secondary circuits of the transformers, the net voltage to the amplifier 10 is as shown in the last waveform, namely a zero (or reference) voltage with the bit-1 pulse, if any, superimposed. That bit-1 pulse can then be easily threshold detected at some level that will allow for some low amplitude noise to be tolerated.

Figure 7:
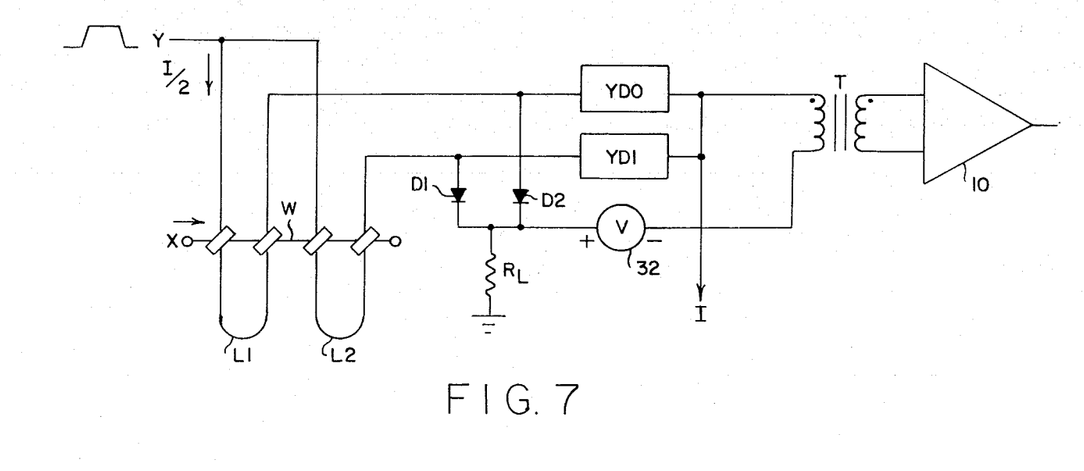
FIG. 7 illustrates another arrangement for cancellation of word line induced noise in a selected pair of bit lines without the need for an extra pair of bit lines.

In an alternative arrangement for cancellation of word drive line crosstalk in the circuit shown in FIG. 7, bit drive current is pulsed through one of two folded bit drive lines L1 and L2 which are physically parallel so that any crosstalk induced in one by a half-select pulse on the word drive line W is also induced in the other bit drive line. One of the two bit drive lines is selectively connected to the primary winding of a transformer T by activating one of two switches YD0 and YD1. If line L1 is selected, diode D1 is forward biased by the half-select bit pulse through the line L1 while the switch YD1 is held off. Diode D2 is not forward biased because the switch YD0 allows half-select current to flow through line L1, thus dropping the voltage on the anode of the diode D2 below the voltage on the anode of D1. The coincident half-select word (X) current will then switch one of the two cores on the selected bit drive line, depending upon the polarity selected for the X pulse, in the normal manner for a Y-folded bit drive line. As in the arrangement of FIG. 4, the line L2 paired with the line L1 for noise cancellation can be easily arranged so that capacitive and inductive crosstalk components from the word drive line will be approximately equal for both bit drive lines. Consequently, the differential voltage applied across the input of the transformer T will consist of only the pulse produced by the switching core. Any noise induced in the line L1 will also be induced in the line L2 and therefore appear only as a common mode signal rejected by the transformer T.

It should be noted that since the diode D1 is forward biased when the line L1 is selected, there is current in the line L2, but it is not sufficient current for one of its two cores to be switched by the X pulse. This arrangement is the same in that respect as the arrangement of FIG. 4. What is different is that an unused line is not paired with the selected line for balancing the half-select current in the selected line, but since the bit drive current is steady at the time the X pulse is applied to switch the core, the detection of a bit 1 read out of a core will be possible, and made easier by cancellation of crosstalk. The advantage of this arrangement is its simplicity and lower cost, even considering an optimum voltage source 32 shown which will simplify the design of the transformer T and the associated dc-restore and sense circuits. The voltage source can be implemented by use of resistors, Zener diodes or other means.

Although particular embodiments of the invention have been described and illustrated herein with reference to folded bit lines, it is recognized that the invention may be practiced with unfolded bit lines, and that other modifications and equivalents may readily occur to those skilled in this art. Consequently, it is intended that the claims be interpreted to cover such modifications and equivalents.

What is claimed is:

1. In a coincident current magnetic core memory comprised of an array of toroidal cores, each core having a bit line driven by half select current and a word select line driven by half select current, an organization for cancellation of crosstalk produced in the bit drive signal on a selected bit line by a drive pulse in a word select line prior to amplification of a bit signal on the selected bit line comprising the arrangement of an unselected bit line physically parallel to the selected bit line for approximately the same inductive and capacitive coupling of a word drive pulse from the word select line, and subtracting means for subtracting the signal coupled into the unselected bit line from the signal coupled into the selected bit line by the word select pulse, wherein said selected bit line and said unselected bit line are paired bit select lines connected to receive bit select current from a controlled source and selectively connected by bit select switching means to conduct half select current to one terminal of said subtracting means, only one of said pair of bit select lines being selected to conduct bit select current to said subtracting means, and switching means for automatically connecting said unselected line to the other terminal of said subtracting means for conduction of bit select current at a level significantly reduced below the half select level of current to the one terminal of said subtracting means.

2. The improvement as defined in claim 1 wherein said subtracting means is comprised of a transformer for coupling the difference between signals on said selected and said unselected bit lines, and a sense amplifier connected to the secondary winding of said transformer, and wherein said automatic switching means is comprised of one diode for each bit line ahead of said bit select switching means, and a load resistor, each diode being connected at a common junction to said resistor for conduction of current, and conductive means for coupling said junction to said other end of the primary winding of said transformer, and means for applying a bus voltage to said junction for back biasing said diodes to be nonconductive except for voltage signals on said bit lines above the voltage level of said controlled current source.

3. The improvement of claim 2 wherein said conductive means and said means for applying a bias voltage is comprised of a voltage source connected in series between the primary winding of said transformer and said junction.

4. The improvement as defined in claim 1 wherein bit lines are arranged in common mode rejection pairs, one bit line of each pair sharing with other bit lines one word select line and the other bit line of each pair sharing with other bit lines another word select line, each of a pair of bit lines being connected at one end to receive half select current at the same time and connected at the other end to said subtracting means for common mode rejection of bit half select current in a bit line selected for reading a bit signal from one of said pair of bit lines in response to a word select pulse on one word line, and each bit line of a pair of unselected bit lines is physically parallel to a bit line of a selected pair of bit lines, and means for selecting a pair of bit lines, said pairs of bit lines being connected together at one end and connected separately at the other end to said subtracting means by said bit select means to subtract from the signal amplified any signal difference produced between said unselected pair of lines and said selected pair of lines by said word select pulse, thereby cancelling any crosstalk between a word select line and bit lines of a selected word.

5. The improvement as defined in claim 4 wherein a plurality of said pairs of lines are connected together at one end to receive bit select current at the same time, each pair of bit lines being connected at the other end thereof to said subtracting means by bit select switching means, whereby only one of said pairs of bit select lines is selected to conduct bit select current, and switching means for automatically connecting the other end of an unselected pair of bit lines to said subtracting means to subtract from the signal amplified any signal difference produced between an unselected pair of lines from the signal produced between a pair of selected lines in response to a word select pulse, whereby an unselected pair of lines are utilized for cancellation of crosstalk between a word select line and a pair of selected bit lines.

6. The improvement of claim 5 wherein said subtracting means is comprised of first and second balun differential transformers having their secondary windings connected in series between input terminals of an amplifier, and having their primary windings connected to receive signals between the lines of a selected pair in one case and between all of the lines of unselected pairs.

7. In a two-line 2½D coincident current magnetic core memory, a bit line driven by a half select current to read a bit out of a core and bit line not driven for reading a bit out of a core placed physically in parallel with the driven bit line to approximate in the undriven bit line the capacitive and inductive coupling of the driven line with a word line driven by a pulse of half select current to read said bit out of said core, whereby the same noise signal produced in the driven bit line by the word drive pulse is produced in the undriven bit line, and sensing means for subtracting from a signal in said driven line a signal in said undriven line to produce as a sensed bit signal the difference, whereby noise produced in said driven bit line by a word pulse is is cancelled, and wherein said driven bit line is paired with another driven bit line for cores of words separately selected from words including cores of said driven bit line for common mode rejection of the bit drive signal, and wherein said undriven bit line is paired with another undriven bit line placed physically in parallel with the other driven bit line paired with the driven bit line.

8. The combination of claim 7 wherein said paired undriven bit lines are bit lines through cores having the same word lines as cores through paired driven lines, said sensing means including selective switching means for driving said paired driven bit lines with half select current and for conducting through said other paired lines a steady-state current below a predetermined half select current level in order to conduct noise pulses induced therein from word select current pulses.

9. The combination of claim 8 wherein said selective switching means is comprised of means for selectively applying a current drive signal to both pairs of bit drive lines simultaneously, paired switch means for allowing only one pair to conduct full half select current, and multiplexing diodes connected to said lines, with a separate diode for each line, for automatically causing the unselected pair to conduct a steady state current below said predetermined half-select current level.

10. The combination of claim 9 including two balun transformers having secondary windings connected in differencing series and a sense amplifier for amplifying the difference signal across said secondary windings, and wherein said paired switch means connect a selected pair of bit lines to opposite ends of the primary of one balun transformer and said multiplexing diodes connect the unselected pair of bit lines to opposite ends of the primary of said second balun transformer.

11. In a two-line 2½D coincident current magnetic core memory, a bit line driven by half select current to read a bit out of a core and a bit line not driven for reading a bit out of a core placed physically in parallel with the driven bit line to approximate in the undriven bit line the capacitive and inductive coupling of the driven line with a word line driven by a pulse of half select current to read said bit out of said core, whereby the same noise signal produced in the driven bit line by the word drive pulse is produced in the undriven bit line, and sensing means for subtracting from a signal in said driven line a signal in said undriven line to produce a sensed bit signal the difference, whereby noise produced in said driven bit line by a word pulse is cancelled, and wherein said driven and undriven bit lines are bit lines through cores having the same word lines, said sending means including selective switching means for driving through said driven bit line half select current, and for conducting through said undriven line a steady state current below a predetermined half select current level in order to conduct noise pulses induced therein from word select current pulses.

12. The combination of claim 11 wherein said selective switching means is comprised of means for selectively applying a current driven signal to both bit drive lines simultaneously, paired switch means for allowing only one bit line to conduct full half select current, and multiplexing diodes connected to said lines, with a separate diode for each line, for automatically causing the unselected line to conduct a steady state current below said predetermined current level.

13. The combination of claim 12 including a transformer and an amplifier, said transformer having its secondary connected to said amplifier and its primary connected to said selective switching means, one terminal of said primary being connected to said paired switch means, and the other terminal of said primary being connected to said multiplexing diodes.

14. The combination of claim 13 wherein said other terminal of said primary is connected to said multiplexing means through a DC bias voltage source connected in series with a polarity to reverse bias said diodes so that neither will conduct unless a current drive signal is applied to said bit lines, and only the one diode connected to the bit line not selected by said paired switch means for half select current conduction will receive a drive signal sufficient to overcome the reverse bias from said source.

* * * * *